United States Patent
Chen et al.

(10) Patent No.: US 11,062,875 B2
(45) Date of Patent: Jul. 13, 2021

(54) IMAGING APPARATUS AND RELATED CONTROL UNIT

(71) Applicant: City University of Hong Kong, Kowloon (HK)

(72) Inventors: Fu-Rong Chen, Kowloon (HK); Pei-En Li, Hsinchu (TW); Ying-Shuo Tseng, Hsinchu (TW)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 16/600,705

(22) Filed: Oct. 14, 2019

(65) Prior Publication Data

US 2021/0110990 A1    Apr. 15, 2021

(51) Int. Cl.
*H01J 37/147* (2006.01)
*H01J 37/22* (2006.01)
*H01J 37/28* (2006.01)

(52) U.S. Cl.
CPC ........ *H01J 37/1475* (2013.01); *H01J 37/222* (2013.01); *H01J 37/28* (2013.01); *H01J 2237/2813* (2013.01)

(58) Field of Classification Search
None
See application file for complete search history.

(56) References Cited

U.S. PATENT DOCUMENTS

| | | | | |
|---|---|---|---|---|
| 7,307,254 B2* | 12/2007 | Yamaguchi | ........... | H01J 37/265 250/207 |
| 2013/0126732 A1* | 5/2013 | Gunji | ................. | H01J 37/1474 250/310 |
| 2013/0306864 A1* | 11/2013 | Seoka | ................... | H01J 37/153 250/307 |
| 2017/0278672 A1* | 9/2017 | Suganuma | ............ | H01J 37/304 |

* cited by examiner

*Primary Examiner* — Andrew Smyth
(74) *Attorney, Agent, or Firm* — Renner Kenner Greive Bobak Taylor & Weber

(57) ABSTRACT

A control unit for controlling a deflector in an imaging apparatus. The imaging apparatus includes an electron gun arranged to provide electron beam to scan a specimen, and the deflector. The deflector is arranged to move the electron beam in a first scanning direction and a second scanning direction that are in the same plane for scanning the specimen. The control unit is configured to determine the first scanning direction and the second scanning direction, and process the determined first scanning direction and the determined second scanning direction based on predetermined equations. The control unit is further configured to provide, based on the processing, a control signal to the deflector to adjust one or both of the first scanning direction and the second scanning direction such that they become substantially orthogonal.

21 Claims, 4 Drawing Sheets

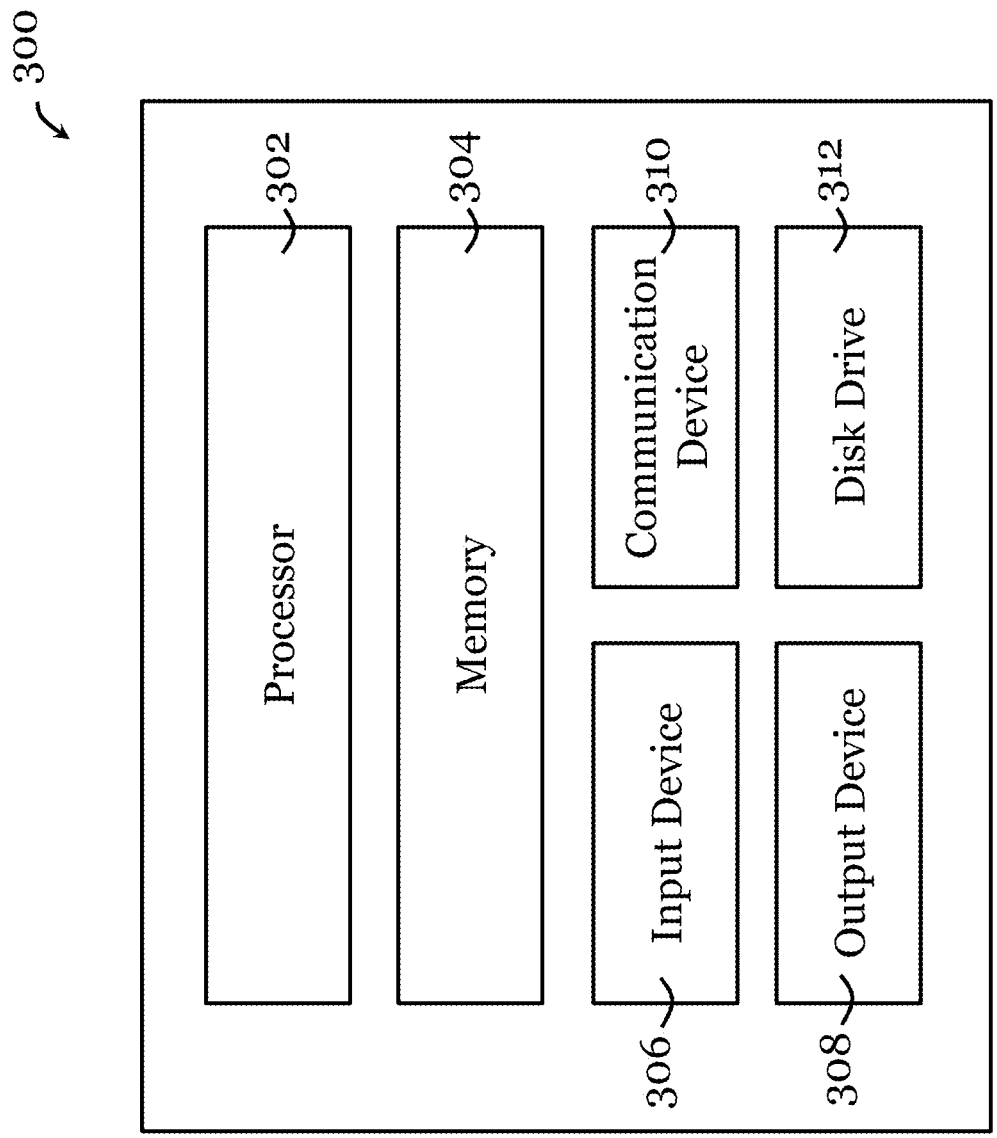

IMAGING APPARATUS AND RELATED CONTROL UNIT

TECHNICAL FIELD

The invention relates to a control unit for controlling a deflector in an imaging apparatus, an imaging apparatus incorporate the control unit, and a method of controlling a deflector in an imaging apparatus.

BACKGROUND

An electron microscope is an imaging apparatus that uses an electron beam as an illumination source for imaging a specimen. The electron beam is typically generated by an electron gun in the microscope. The focus of the electron beam is then modified by an electromagnetic "lens system". A deflector, in the form of coil(s), is energized (adjustable) to move the electron beam in first and second scanning directions in the same plane for scanning the specimen. The orthogonal degree between the two scanning directions or lines, generally referred to as orthogonality, is an important parameter that determines the quality of the image produced. In operation, orthogonality should be controlled such that the two scanning directions or lines can be regarded as being orthogonal to each other (as close to 90 degrees as possible) in order to minimize image distortion. The manufacture tolerance and assembly error of the deflector may complicate the achievement of this object.

SUMMARY OF THE INVENTION

In accordance with a first aspect of the invention, there is provided a control unit for controlling a deflector in an imaging apparatus. The imaging apparatus has an electron gun arranged to provide electron beam to scan a specimen, and the deflector. The deflector is arranged to move the electron beam in a first scanning direction and a second scanning direction that are in the same plane for scanning the specimen. The control unit is configured to determine the first scanning direction and the second scanning direction, process the determined first scanning direction and the determined second scanning direction based on predetermined equations, and provide, based on the processing, a control signal to the deflector to adjust one or both of the first scanning direction and the second scanning direction such that (i) the first scanning direction and the second adjusted scanning direction are within a required orthogonality limit or (ii) the first adjusted scanning direction and the second adjusted scanning direction are within a required orthogonality limit. The deflector may comprise one or more deflector coils. The current running through the coils is regulated to control the scanning directions of the deflector.

The control unit may be arranged to provide the control signal to the deflector to adjust only one of the first scanning direction and the second scanning direction such that the first scanning direction and the second adjusted scanning direction are within the required orthogonality.

The required orthogonality (angle between the first and second scanning directions in the ideal case) may be between 85 degrees to 95 degrees, preferably between 89 degrees to 91 degrees, more preferably about 90 degrees.

The control unit may be arranged to process the determined first scanning direction and the determined second scanning direction by comparing the first scanning direction with a first reference direction, and comparing the second scanning direction with a second reference direction. The first reference direction and the second reference direction are substantially orthogonal.

The control unit may be arranged to determine the first scanning direction and the second scanning direction by analyzing an image of the specimen produced by the imaging apparatus.

The control unit may be arranged to determine the first scanning direction and the second scanning direction by determining an extent of orthogonality of the first scanning direction and the second scanning direction.

In this first aspect, the predetermined equations may include $A = A' - B' \cdot \sin \phi$ $B = B' \cdot \cos \phi$ where A' is a detected amplitude of a drive signal in the first scanning direction, B' is a detected amplitude of a drive signal in the second scanning direction, A is a required amplitude of a drive signal in the first reference scanning direction, B is a required amplitude of a drive signal in the second reference scanning direction, $\phi$ is a deviation angle between the second scanning direction and the second reference scanning direction. The control signal is arranged to control the deflector based on A and B.

In this first aspect, the predetermined equations may include $A = A' - B \cdot \sin \phi$ $B = B'$ where A' is a detected amplitude of a drive signal in the first scanning direction, B' is a detected amplitude of a drive signal in the second scanning direction, A is a required amplitude of a drive signal in the first reference scanning direction, B is a required amplitude of a drive signal in the second reference scanning direction, $\phi$ is a deviation angle between the second scanning direction and the second reference scanning direction. The control signal is arranged to control the deflector based on A and B. These predetermined equations can be applied when $\phi$ is smaller than 45 degrees, when $\phi$ is smaller than 30 degrees, when $\phi$ is smaller than 15 degrees, when $\phi$ is smaller than 10 degrees, or when $\phi$ is smaller than 5 degrees.

In some embodiments the control unit includes an analog circuit arranged to provide the control signal to the deflector. In some other embodiments the control unit includes a field-programmable gate array circuit arranged to provide the control signal to the deflector. The control unit may further include a processor for analyzing an image produced by the imaging apparatus to determine the first and second scanning directions.

The imaging apparatus may be an electron microscope (e.g., a scanning electron microscope) or an inspection apparatus for inspecting objects (such as semiconductors).

In accordance with a second aspect of the invention, there is provided an imaging apparatus comprising: an electron gun arranged to provide electron beam to scan a specimen, a deflector being arranged to move the electron beam in a first scanning direction and a second scanning direction that are in the same plane for scanning the specimen; and the control unit of the first aspect. The imaging apparatus may be an electron microscope (e.g., a scanning electron microscope) or an inspection apparatus for inspecting objects (such as semiconductors). The deflector may comprise one or more deflector coils. The current running through the coils is regulated to control the scanning directions of the deflector.

In accordance with a third aspect of the invention, there is provided a method for controlling a deflector in an imaging apparatus. The imaging apparatus comprises an electron gun arranged to provide electron beam to scan a specimen, and the deflector. The deflector is arranged to move the electron beam in a first scanning direction and a second scanning direction that are in the same plane for scanning the specimen. The method includes: determining the first scanning direction and the second scanning direction, and processing the determined first scanning direction and the determined second scanning direction based on predetermined equations. The method also includes providing, based on the processing, a control signal to the deflector to adjust one or both of the first scanning direction and the second scanning direction such that (i) the first scanning direction and the second adjusted scanning direction are within a required orthogonality limit or (ii) the first adjusted scanning direction and the second adjusted scanning direction are within a required orthogonality limit.

The method may include providing, based on the processing, a control signal to the deflector to adjust only one of the first scanning direction and the second scanning direction such that the first scanning direction and the second adjusted scanning direction are within the required orthogonality.

In this third aspect, the required orthogonality (angle between the first and second scanning directions in the ideal case) may be between 85 degrees to 95 degrees, preferably between 89 degrees to 91 degrees, more preferably about 90 degrees.

Processing the determined first scanning direction and the determined second scanning direction may include comparing the first scanning direction with a first reference direction, and comparing the second scanning direction with a second reference direction. The first reference direction and the second reference direction are substantially orthogonal.

Determining the first scanning direction and the second scanning direction may include analyzing an image of the specimen produced by the imaging apparatus. Determining the first scanning direction and the second scanning direction may include determining an extent of orthogonality of the first scanning direction and the second scanning direction.

In this third aspect, the predetermined equations may include $$A = A' - B' \cdot \sin \phi$$

$$B = B' \cdot \cos \phi$$

where A' is a detected amplitude of a drive signal in the first scanning direction, B' is a detected amplitude of a drive signal in the second scanning direction, A is a required amplitude of a drive signal in the first reference scanning direction, B is a required amplitude of a drive signal in the second reference scanning direction, $\phi$ is a deviation angle between the second scanning direction and the second reference scanning direction. The control signal is arranged to control the deflector based on A and B.

In this third aspect, the predetermined equations may include $$A = A' - B \cdot \sin \phi$$

$$B = B'$$

where A' is a detected amplitude of a drive signal in the first scanning direction, B' is a detected amplitude of a drive signal in the second scanning direction, A is a required amplitude of a drive signal in the first reference scanning direction, B is a required amplitude of a drive signal in the second reference scanning direction, $\phi$ is a deviation angle between the second scanning direction and the second reference scanning direction. The control signal is arranged to control the deflector based on A and B. These predetermined equations can be applied when $\phi$ is smaller than 45 degrees, when $\phi$ is smaller than 30 degrees, when $\phi$ is smaller than 15 degrees, or when $\phi$ is smaller than 10 degrees, when $\phi$ is smaller than 5 degrees.

The imaging apparatus may be an electron microscope (e.g., a scanning electron microscope) or an inspection apparatus for inspecting objects (such as semiconductors).

BRIEF DESCRIPTION OF THE DRAWINGS

Embodiments of the invention will now be described, by way of example, with reference to the accompanying drawings in which:

FIG. 5 is a functional block diagram of an information handling system that can be used as at least part of the control unit in one embodiment of the invention.

DETAILED DESCRIPTION

Figure 1:
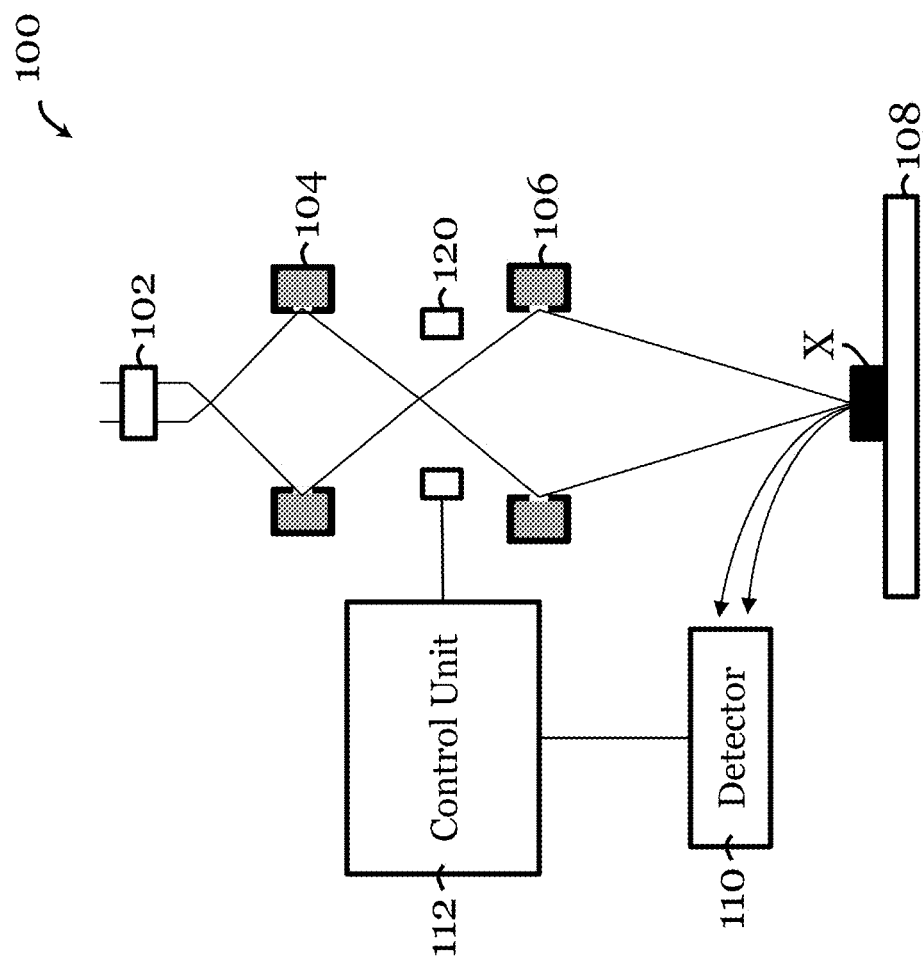
FIG. 1 is a schematic view of a scanning electron microscope with a control unit for controlling its deflector in one embodiment of the invention.

FIG. 1 shows a simplified schematic of a scanning electron microscope 100 in one embodiment of the invention. The microscope 100 may provide a vacuum environment in which the components of the microscope 100 are arranged. The microscope 100 includes an electron gun 102 arranged to generate an electron stream. A set of condenser lens 104 (e.g., formed by electromagnetic coils) is arranged to control the focus the electron steam, and a set of electron lens 106 (e.g., formed by electromagnetic coils) downstream of the condenser lens 104 is arranged to further adjust the focus on the electron stream to focus the electron beam on the specimen X placed on a platform 108. A deflector 120 (e.g., formed by electromagnetic coils) may be arranged between the condenser lens 104 and the electron lens 106 to move the electron beam to control a scanning or imaging of the specimen X. A current source (not shown) is connected with the deflector 120 to provide current to operate the deflector 120 hence control the magnetic field generated by the deflector 120 to control the electron beam. The electron beam applied to the specimen X triggers the specimen X to provide a corresponding electron beam, which is then picked up by a detector 110 to generate an image of the specimen X. In this process, the deflector 120 moves the electron beam in X and Y scanning directions in the same plane for scanning the specimen X.

The microscope 100 of FIG. 1 further includes a control unit 112. The control unit 112 include one or more of an information handling system and/or a circuit (e.g., analog circuit, field-programmable gate array circuit) for providing a control signal (e.g., current, voltage, etc.) to the deflector, a camera, etc.

The control unit 112 determines the first scanning direction and the second scanning direction provided by the deflector 120. For example, the control unit 112 may compare the first scanning direction with a first reference direction and compare the second scanning direction with a second reference direction (the first reference direction and the second reference direction are substantially orthogonal). The control unit 112 may include a processor to analyze an image of the specimen X produced by the imaging apparatus 100. This process could involve the control unit 112 determining an extent of orthogonality of the first scanning direction and the second scanning direction.

The control unit 112 also processes the determined first scanning direction and the determined second scanning direction based on predetermined equations.

The predetermined equations may include $$A = A' - B' \cdot \sin \phi$$

$$B = B' \cdot \cos \phi$$

where A' is a detected amplitude of a drive signal in the first scanning direction, B' is a detected amplitude of a drive signal in the second scanning direction, A is a required amplitude of a drive signal in the first reference scanning direction, B is a required amplitude of a drive signal in the second reference scanning direction, φ is a deviation angle between the second scanning direction and the second reference scanning direction. The control signal is arranged to control the deflector based on A and B. These predetermined equations can be referred to as the first set of equations.

Alternatively, or additionally, the predetermined equations may include $$A = A' \cdot B \cdot \sin \phi$$

$$B = B'$$

where A' is a detected amplitude of a drive signal in the first scanning direction, B' is a detected amplitude of a drive signal in the second scanning direction, A is a required amplitude of a drive signal in the first reference scanning direction, B is a required amplitude of a drive signal in the second reference scanning direction, φ is a deviation angle between the second scanning direction and the second reference scanning direction. The control signal is arranged to control the deflector based on A and B. These predetermined equations can be referred to as the second set of equations. In one example, this second set of predetermined equations is applied when φ is smaller than 45 degrees. In another embodiment, this second set of predetermined equations is applied when φ is smaller than 30 degrees. In another embodiment, this second set of predetermined equations is applied when φ is smaller than 15 degrees. In another embodiment, this second set of predetermined equations is applied when φ is smaller than 10 degrees. In some embodiments, the first set of predetermined equations is used when φ is out of range for using the second set of predetermined equations.

Based on the processing, the control unit 112 then provides a current control signal to the deflector 120 to adjust one or both of the first scanning direction and the second scanning direction such that they become substantially orthogonal (e.g., within a required orthogonality limit). The two scanning directions are considered to be substantially orthogonal when the angle between the first and second scanning directions are between 85 degrees to 95 degrees, preferably between 89 degrees to 91 degrees, more preferably about 90 degrees.

Figure 2:
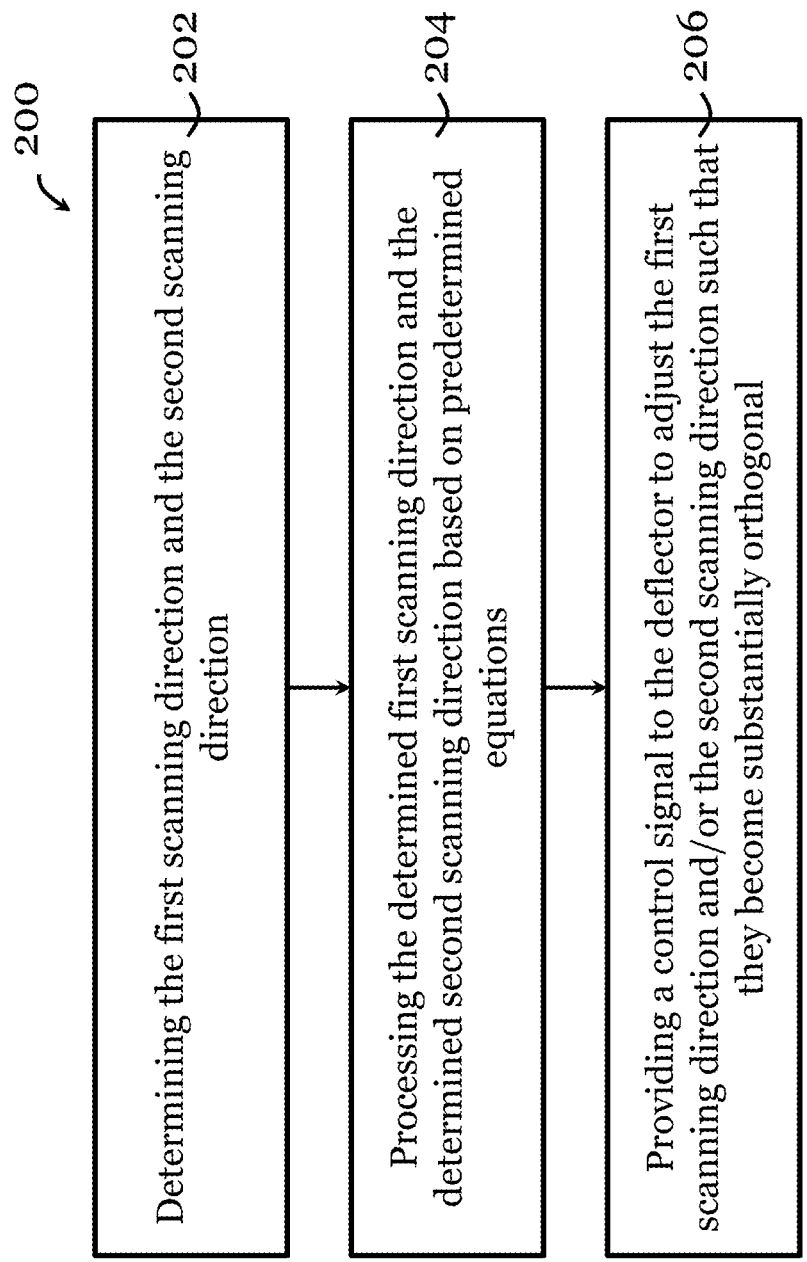
FIG. 2 is a method for controlling a deflector in an imaging apparatus in one embodiment of the invention.

FIG. 2 shows a method 200 for controlling a deflector in an imaging apparatus, such that the imaging apparatus 100 of FIG. 1, in one embodiment of the invention. The imaging apparatus to which the method 200 can be applied includes an electron gun arranged to provide electron beam to scan a specimen, and a deflector arranged to move the electron beam in a first scanning direction and a second scanning direction that are in the same plane for scanning the specimen.

The method 200 includes, in step 202, determining the first scanning direction and the second scanning direction. In one example, in step 202, determining the first scanning direction and the second scanning direction includes analyzing an image of the specimen produced by the imaging apparatus, and/or determining an extent of orthogonality of the first scanning direction and the second scanning direction.

The method 200 then proceeds to step 204, to process the determined first scanning direction and the determined second scanning direction based on predetermined equations. The predetermined equations may be the first and/or the second set illustrated in the description relating to FIG. 1. In one example, in step 204, processing the determined first scanning direction and the determined second scanning direction may include comparing the first scanning direction with a first reference direction, and comparing the second scanning direction with a second reference direction (the first reference direction and the second reference direction are substantially orthogonal).

Subsequently, the method 200 proceeds to step 206, to provide, based on the processing, a control signal to the deflector to adjust one or both of the first scanning direction and the second scanning direction such that they are within a required (predetermined) orthogonality limit. The two scanning directions are considered to be substantially orthogonal when the angle between the first and second scanning directions are between 85 degrees to 95 degrees, preferably between 89 degrees to 91 degrees, more preferably about 90 degrees.

Figure 3:
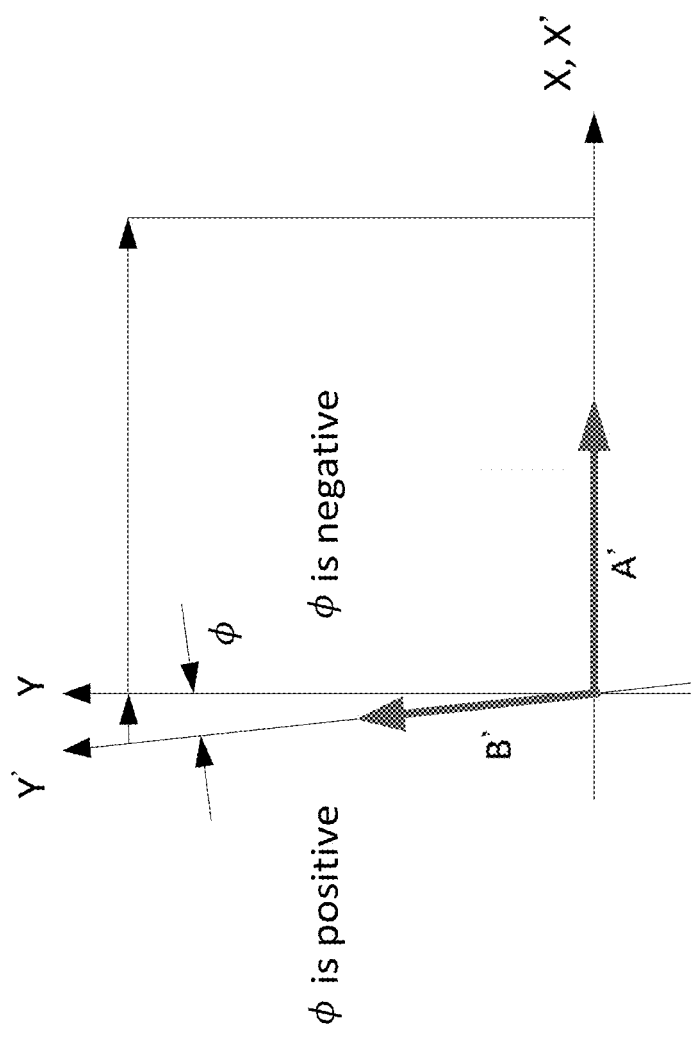
FIG. 3 is a graph illustrating adjustment of scanning directions of the deflector in FIG. 1.

FIG. 3 shows a graph that illustrates adjustment of scanning directions of the deflector 120 in FIG. 1. In FIG. 3, A' and B' are the drive signal amplitudes applied in original (skewed) scanning directions x' and y'; the A and B are the drive signal amplitudes applied in adjusted (substantially) orthogonal scanning directions x and y; and φ is the deviation angle.

This set of equations explains the relationship between the parameters:

$$A\vec{x}' + B\vec{y}' = A\vec{x} + B\vec{y}$$

$$\vec{x}' = \vec{x}$$

$$\vec{y}' = -\sin\phi \cdot \vec{x} + \cos\phi \cdot \vec{y}$$

Accordingly, the required (ideal) drive signal amplitudes A and B in the orthogonal scanning directions can be described by this set of equations:

$$A = A' - B' \cdot \sin \phi$$

$$B = B' \cdot \cos \phi$$

By making A' and B' the subject of the equations:

$$A' = A + B \cdot \frac{\sin\phi}{\cos\phi}$$

$$B' = B \cdot \frac{1}{\cos\phi}$$

Clearly, when ϕ is small (e.g., ϕ less than 10°, etc.), A' and B' can be approximated by:

$$A'=A+B\cdot\sin\phi$$

$$B'=B$$

In other words, when ϕ is small (e.g., ϕ less than 10°, etc.):

$$A=A'-B\cdot\sin\phi$$

$$B=B'$$

Figure 4:
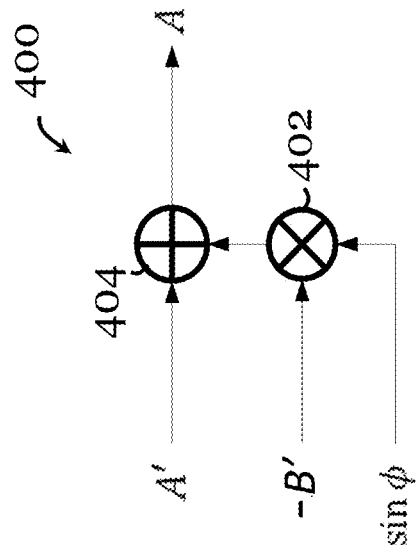
FIG. 4 is an analog circuit arranged in the control unit of FIG. 1 in one embodiment of the invention.

The calculation based on A=A'−B·sin ϕ can be realized by the analog circuit 400 of FIG. 4. The analog circuit 400 includes, simply, a multiplier (current or voltage multiplier) that determines −B·sin ϕ, and an adder 404, which adds A' to −B·sin ϕ. The output signal may be a current signal or a voltage signal.

Referring to FIG. 5, there is shown a schematic diagram of an exemplary information handling system 300 that can be used as at least part of the control unit 112 in one embodiment of the invention. The information handling system 300 may have different configurations, and it generally comprises suitable components necessary to receive, store, and execute appropriate computer instructions, commands, or codes. The main components of the information handling system 300 are a processor 302 and a memory unit 304. The processor 302 may be formed by one or more CPU, MCU, controllers, logic circuits, Raspberry Pi chip, etc. The memory unit 304 may include one or more volatile memory unit (such as RAM, DRAM, SRAM), one or more non-volatile unit (such as ROM, PROM, EPROM, EEPROM, FRAM, MRAM, FLASH, SSD, NAND, and NVDIMM), or any of their combinations. The information handling system 300 may further include one or more input devices 306 such as a keyboard, a mouse, a stylus, an image scanner, a microphone, a tactile input device (e.g., touch sensitive screen), and an image/video input device (e.g., camera). The image/video input device may be used to form an image of the specimen. The information handling system 300 may further include one or more output devices 308 such as one or more displays (e.g., monitor), speakers, disk drives, headphones, earphones, printers, 3D printers, etc. The display may include a LCD display, a LED/OLED display, or any other suitable display that may or may not be touch sensitive. The display may be used to show the imaged specimen. The information handling system 300 may further include one or more disk drives 312 which may encompass solid state drives, hard disk drives, optical drives, flash drives, and/or magnetic tape drives. A suitable operating system may be installed in the information handling system 300, e.g., on the disk drive 312 or in the memory unit 304. The memory unit 304 and the disk drive 312 may be operated by the processor 302. The information handling system 300 also preferably includes a communication device 310 for establishing one or more communication links (not shown) with one or more other computing devices such as servers, personal computers, terminals, tablets, phones, or other wireless or handheld computing devices. The communication device 310 may be a modem, a Network Interface Card (NIC), an integrated network interface, a radio frequency transceiver, an optical port, an infrared port, a USB connection, or other wired or wireless communication interfaces. The communication links may be wired or wireless for communicating commands, instructions, information and/or data. Preferably, the processor 302, the memory unit 304, and optionally the input devices 306, the output devices 308, the communication device 310 and the disk drives 312 are connected with each other through a bus, a Peripheral Component Interconnect (PCI) such as PCI Express, a Universal Serial Bus (USB), an optical bus, or other like bus structure. In one embodiment, some of these components are connected through a network such as the Internet or a cloud computing network. A person skilled in the art would appreciate that the information handling system 300 shown in FIG. 5 is merely exemplary and different information handling systems 300 with different configurations may be applicable in the control unit 112.

Although not required, the embodiments described with reference to the Figures can be implemented as an application programming interface (API) or as a series of libraries for use by a developer or can be included within another software application, such as a terminal or personal computer operating system or a portable computing device operating system. Generally, as program modules include routines, programs, objects, components and data files assisting in the performance of particular functions, the skilled person will understand that the functionality of the software application may be distributed across a number of routines, objects or components to achieve the same functionality desired herein.

It will also be appreciated that where the methods and systems of the invention are either wholly implemented by computing system or partly implemented by computing systems then any appropriate computing system architecture may be utilized. This will include stand-alone computers, network computers, dedicated or non-dedicated hardware devices. Where the terms "computing system" and "computing device" are used, these terms are intended to include any appropriate arrangement of computer or information processing hardware capable of implementing the function described.

The above embodiments of the invention provides a simple and computation efficient means to control the deflector in the microscope to reduce image distortion. The control can be affected in real-time, and does not require specific calibration with specific specimen samples. The use of some of the equations readily simplifies the processing and control of the deflector.

It will be appreciated by persons skilled in the art that numerous variations and/or modifications may be made to the invention as shown in the specific embodiments without departing from the spirit or scope of the invention as broadly described. The described embodiments of the invention should therefore be considered in all respects as illustrative, not restrictive.

Although a scanning electron microscope is specifically described in the above embodiments, the inventions concerning the control unit and its method of operation can be applied in another imaging apparatus in another embodiment. The imaging apparatus would generally include an electron gun arranged to provide electron beam to scan a specimen and a deflector arranged to move the electron beam in a first scanning direction and a second scanning direction that are in the same plane for scanning the specimen. The deflector may be formed by one or more deflective coils energized by a power source or a signal source (e.g., provided by the control unit). The equations presented above may be implemented or expressed in a different way, provided they serve the same function to assist in processing the scanning directions and to determine a suitable control signal to control the deflector.

The invention claimed is:

1. A control unit for controlling a deflector in an imaging apparatus, the imaging apparatus having an electron gun arranged to provide electron beam to scan a specimen, and the deflector, the deflector being arranged to move the electron beam in a first scanning direction and a second scanning direction that are in the same plane for scanning the specimen, wherein the control unit is configured to:
   determine the first scanning direction and the second scanning direction; and
   process the determined first scanning direction and the determined second scanning direction based on predetermined equations, the predetermined equations including A=A'−B·sin ϕ and B−B', where A' is a detected amplitude of a drive signal in the first scanning direction, B' is a detected amplitude of a drive signal in the second scanning direction, A is a required amplitude of a drive signal in the first reference scanning direction, B is a required amplitude of a drive signal in the second reference scanning direction, ϕ is a deviation angle between the second scanning direction and the second reference scanning direction and ϕ is smaller than 45 degrees, wherein the control unit includes a circuit configured to:
   determine A based on the first predetermined equation; and
   provide, based on the determination of A, a control signal to the deflector, to control the deflector based on A and B to adjust one or both of the first scanning direction and the second scanning direction such that (i) the first scanning direction and the second adjusted scanning direction are within a required orthogonality limit or (ii) the first adjusted scanning direction and the second adjusted scanning direction are within a required orthogonality limit.

2. The control unit of claim 1, wherein the circuit is arranged to provide the control signal to the deflector to adjust only one of the first scanning direction and the second scanning direction such that the first scanning direction and the second adjusted scanning direction are within the required orthogonality.

3. The control unit of claim 1, wherein the required orthogonality is between 85 degrees to 95 degrees.

4. The control unit of claim 1, wherein the required orthogonality is between 89 degrees to 91 degrees.

5. The control unit of claim 1, wherein the required orthogonality is about 90 degrees.

6. The control unit of claim 1, wherein the control unit is arranged to process the determined first scanning direction and the determined second scanning direction by
   comparing the first scanning direction with a first reference direction, and
   comparing the second scanning direction with a second reference direction, wherein the first reference direction and the second reference direction are substantially orthogonal.

7. The control unit of claim 1, wherein the control unit is arranged to determine the first scanning direction and the second scanning direction by analyzing an image of the specimen produced by the imaging apparatus.

8. The control unit of claim 1, wherein the control unit is arranged to determine the first scanning direction and the second scanning direction by determining an extent of orthogonality of the first scanning direction and the second scanning direction.

9. The control unit of claim 1, wherein ϕ is smaller than 30 degrees.

10. The control unit of claim 1, wherein ϕ is smaller than 15 degrees.

11. The control unit of claim 1, wherein ϕ is smaller than 10 degrees.

12. The control unit of claim 1, wherein the circuit comprises an analog circuit.

13. The control unit of claim 1, wherein the circuit comprises a field-programmable gate array circuit.

14. The control unit of claim 1, wherein the imaging apparatus is an electron microscope.

15. The control unit of claim 14, wherein the imaging apparatus is a scanning electron microscope.

16. The control unit of claim 14, wherein the imaging apparatus is an inspection apparatus for inspecting semiconductors.

17. An imaging apparatus comprising:
   an electron gun arranged to provide electron beam to scan a specimen,
   a deflector being arranged to move the electron beam in a first scanning direction and a second scanning direction that are in the same plane for scanning the specimen; and
   a control unit operably connected with the deflector, the control unit being configured to:
      determine the first scanning direction and the second scanning direction; and
      process the determined first scanning direction and the determined second scanning direction based on predetermined equations, the predetermined equations including A=A'−B·sin ϕ and B−B', where A' is a detected amplitude of a drive signal in the first scanning direction, B' is a detected amplitude of a drive signal in the second scanning direction, A is a required amplitude of a drive signal in the first reference scanning direction, B is a required amplitude of a drive signal in the second reference scanning direction, ϕ is a deviation angle between the second scanning direction and the second reference scanning direction and ϕ is smaller than 45 degrees, wherein the control unit includes a circuit configured to:
      determine A based on the first predetermined equation; and
      provide, based on the determination of A, a control signal to the deflector, to control the deflector based on A and B to adjust one or both of the first scanning direction and the second scanning direction such that (i) the first scanning direction and the second adjusted scanning direction are within a required orthogonality limit or (ii) the first adjusted scanning direction and the second adjusted scanning direction are within a required orthogonality limit.

18. A method for controlling a deflector in an imaging apparatus, wherein the imaging apparatus comprises an electron gun arranged to provide an electron beam to scan a specimen, and the deflector, is arranged to move the electron beam in a first scanning direction and a second scanning direction, wherein the first scanning direction and the second scanning direction are in the same plane for scanning the specimen, wherein the method comprises:
   determining the first scanning direction and the second scanning direction;

processing the determined first scanning direction and the determined second scanning direction based on predetermined equations, the predetermined equations including $A=A'-\sin\phi$ and $B=B'$, where $A'$ is a detected amplitude of a drive signal in the first scanning direction, $B'$ is a detected amplitude of a drive signal in the second scanning direction, $A$ is a required amplitude of a drive signal in the first reference scanning direction, $B$ is a required amplitude of a drive signal in the second reference scanning direction, $\phi$ is a deviation angle between the second scanning direction and the second reference scanning direction and is smaller than 45 degrees;

determining $A$ based on the first predetermined equation using a circuit of a control unit operatively connected with the deflector; and providing, using the circuit and based on the determination of $A$, a control signal to the deflector, to control the deflector based on $A$ and $B$ to adjust one or both of the first scanning direction and the second scanning direction such that (i) the first scanning direction and the second adjusted scanning direction are within a required orthogonality limit or (ii) the first adjusted scanning direction and the second adjusted scanning direction are within a required orthogonality limit.

19. The control unit of claim 12, wherein the analog circuit comprises:

a multiplier that determines $-\sin\phi$; and an adder that adds $A'$ to $-\sin\phi$.

20. The imaging apparatus of claim 17, wherein the circuit comprises an analog circuit.

21. The imaging apparatus of claim 17, wherein the circuit comprises a field-programmable gate array circuit.

* * * * *